United States Patent
Tsuruta et al.

(10) Patent No.: US 7,267,926 B2
(45) Date of Patent: Sep. 11, 2007

(54) ACTIVE ENERGY BEAM CURING TYPE CONDUCTIVE PASTE, PRODUCTION METHOD AND DEVICE FOR CONDUCTOR CIRCUIT SUBSTRATE AND NON-CONTACT ID AND PRODUCTION METHOD THEREOF

(75) Inventors: Hiroaki Tsuruta, Tokyo (JP); Minoru Nakamura, Tokyo (JP); Masanori Akita, Osaka (JP); Koji Ito, Osaka (JP); Toshihiro Mori, Osaka (JP)

(73) Assignee: Toray Engineering Co., Ltd., Osaka-shi (JP)

( * ) Notice: Subject to any disclaimer, the term of this patent is extended or adjusted under 35 U.S.C. 154(b) by 751 days.

(21) Appl. No.: 10/204,308

(22) PCT Filed: Feb. 20, 2001

(86) PCT No.: PCT/JP01/01207

§ 371 (c)(1),
(2), (4) Date: Aug. 21, 2002

(87) PCT Pub. No.: WO01/61710

PCT Pub. Date: Aug. 23, 2001

(65) Prior Publication Data

US 2003/0091751 A1    May 15, 2003

(30) Foreign Application Priority Data

Feb. 21, 2000 (JP) .............................. 2000-042822
Sep. 4, 2000 (JP) .............................. 2000-266389

(51) Int. Cl.
*G03F 7/26* (2006.01)
(52) U.S. Cl. .................. 430/296; 430/322; 355/18
(58) Field of Classification Search ............... 430/322, 430/296; 355/18; 250/492.2
See application file for complete search history.

(56) References Cited

U.S. PATENT DOCUMENTS 4,682,415 A    7/1987 Adell ..................... 29/846
5,403,649 A *  4/1995 Morgan et al. ........... 428/209
6,358,437 B1 * 3/2002 Jonas et al. .............. 252/500

FOREIGN PATENT DOCUMENTS

| GB | 1 189 124 | 4/1970 |
|---|---|---|
| JP | 59-173904 | 10/1984 |
| JP | 2-212143 | 8/1990 |
| JP | 2-272071 | 11/1990 |
| JP | 2-290280 | 11/1990 |
| JP | 6-162818 | 6/1994 |
| JP | 9-130019 | 5/1997 |
| JP | 10-14897 | 1/1998 |
| JP | 10-211784 | 8/1998 |
| JP | 10-247419 | 9/1998 |
| JP | 11-91275 | 4/1999 |
| JP | 11-96833 | 4/1999 |
| JP | 11-339544 | * 12/1999 |
| JP | 2001-64547 | 3/2001 |

OTHER PUBLICATIONS

"Denshisen Shosha wo mochita Insatsu Teikou no Kouseihou" Circuit Technology, vol. 2, No. 2, pp. 73-80 1987.
Patent Abstracts of Japan, JP 11-096833, Apr. 9, 1999.

* cited by examiner

Primary Examiner—Kathleen Duda
(74) Attorney, Agent, or Firm—Oblon, Spivak, McClelland, Maier & Neustadt, P.C.

(57) ABSTRACT

There are disclosed; an active energy beam curing type conductive paste, containing a conductive substance, and an active energy beam polymerizable compound, wherein a cured matter, obtained when a composition of the paste excluding the conductive substance is cured with an electron beam having an acceleration voltage of 150 kV and an irradiated dose of 40 kGy, has an internal stress of 5 to 50 Mpa; a production method and a device for a conductor circuit substrate using the active energy beam curing type conductive paste; and a non-contact ID using the active energy beam curing type conductive paste and a production method for the ID.

8 Claims, 3 Drawing Sheets

ACTIVE ENERGY BEAM CURING TYPE CONDUCTIVE PASTE, PRODUCTION METHOD AND DEVICE FOR CONDUCTOR CIRCUIT SUBSTRATE AND NON-CONTACT ID AND PRODUCTION METHOD THEREOF

TECHNICAL FIELD

The present invention relates to an active energy beam curing type conductive paste, and a production method for a conductor circuit substrate using the same. In addition, the present invention relates to a production method and a device for a conductor circuit substrate preferably applied, for example, to a non-contact ID antenna, the non-contact ID and a production method therefor.

BACKGROUND ART

In recent years, demands for non-contact IC cards and non-contact IC tags (hereinafter referred to as "non-contact ID") for use in telephone cards, commuter passes, and the like have been increasing. The non-contact ID uses a radio wave for transmission/reception of data such as the residual quantity of the telephone card, and the effective limit of the commuter pass, and generates, by a radio wave outside, electric power necessary for the communication of data.

One method for producing a circuit for communication with the outside/power generation, which is so-called antenna circuit, is a printing with a conductive paste. Conductive paste of a thermosetting or thermoplastic type is printed on a resin film substrate such as polycarbonate, polyester, polyester alloy, and vinyl chloride, and is thermally cured or dried using a hot air circulation oven to form the circuit.

The thermosetting type conductive paste is required to be heated at high temperature after coating or printing on the substrate (base, or matter to be coated), since it uses as a binder a thermosetting resin such as epoxy resin, and vinyl resin and/or an inorganic substance such as glass frit. However, heat curing requires a large amount of energy, a long heating time, and a large floor area for mounting heating apparatus, and thus is not only uneconomical, but also suffers from the limitations described below.

That is, a conductive paste using as a binder an inorganic substance such as a glass frit generally needs to be fired at 800° C. or more, which is therefore not appropriate for a synthetic resin based substrate. On the other hand, a conductive paste using as a binder a thermosetting resin is applicable to a synthetic resin based substrate. The material of the resin film substrate often has, however, poor thermal resistance, and typically has a thermal deformation temperature of 120° C. or less, in view of printability, adhesiveness, laminating property, embossing workability, and costs. Accordingly, the substrate is deformed by heat curing of the paste at about 120° C. to 150° C. for 10 to 30 minutes. It becomes a serious obstacle; for example, parts placement is hindered in a subsequent step using the resultant printed wiring circuit. Specifically, the resin film substrate changes in size by as much as 0.1 to 0.5% in transverse and longitudinal directions, after the substrate is dried or cured. The change and the amount of change are not uniform in-plane, since the substrate is subjected to heat history. In extreme cases, the resin film substrate suffers unevenness, warping and wrinkling. The dimensional change is especially apparent when unwinding and winding the resin film in the form of a web (a strip or a roll). The deformation and dimensional change of the resin film substrate not only deteriorate the appearance of the resin film substrate, but also break the conductor circuit, or alter the impedance of the antenna conductor circuit, thus adversely affecting its functions. Also, there is difficulty in alignment, and a cycle time becomes prolonged when the IC chip is bonded to an electrode section of the conductor circuit to fabricate the non-contact ID.

If the condition of heat curing is at 120° C. for 30 minutes, and the resin film substrate is transported at a rate of 1 m/min, the use of a long hot air circulation oven having a length of as much as 30 m is required. Enormous space is required for its placement, and it is difficult to transport the resin film substrate stably with low tension for such a long distance at high temperatures.

The conductor circuit using the thermoplastic conductive paste is often utilized in the keyboard of a personal computer, etc. The substrate made of, for example, polyethylene terephthalate contracts in the step of drying the conductive paste. As a countermeasure, the substrate should be pretreated, i.e., annealed. Further, it requires 30 to 60 minutes to dry. The resultant conductor circuit has a defect of poor solvent resistance, etc.

An attempt has been made to form the conductor circuit with an electron beam curing type conductive paste. Using the electron beam curing type conductive paste, the substrate is heated less for curing as compared with the thermosetting or thermoplastic conductive paste, whereby the deformation of the substrate and the obstacle in the subsequent step as described above can be avoided to advantageously conduct mass production of the conductor circuits. However, the electron beam curing type conductive paste has problems, for example, in initial conductivity, and adhesiveness upon film forming.

To overcome such problems, Japanese Unexamined Patent Application Publication No. 59-173904 discloses a method for producing a conductive linear matter by irradiating an electron beam for curing, and then heating. According to this method, the cured matter has improved conductivity, but it requires heating at 100° C. to 150° C. for 5 to 60 minutes after the electron beam irradiation, which makes it difficult to apply this method to substrates having low heat resistance. Japanese Unexamined Patent Application Publication No. 2-290280 discloses a method for curing a conductive paint coated matter by irradiating an electron beam while keeping the coated matter at 50° C. or more. This method lowers the heating temperature, and decreases the adverse effects on the substrate. However, the uncured coated matter has an increased temperature and decreased viscosity depending on the paste, whereby it becomes difficult to form a fine pattern. Furthermore, the adhesiveness should be improved upon film forming.

DISCLOSURE OF INVENTION

An object of the present invention is to provide a conductive paste that can be used for a substrate having poor heat resistance, has a suitable volume resistivity, and excellent hardness, strength, and adhesiveness to the substrate upon film forming. Such conductive paste is cured in a very short time in the conductor circuit production, which can realize the mass production of the conductor circuit substrate, and is effective in decreasing the production costs.

Another object of the present invention is to provide a method for producing a conductor circuit (where a circuit pattern is formed on a substrate, which is hereinafter referred to as "conductor circuit substrate") having excellent initial conductivity, hardness, strength, and adhesiveness to the substrate upon film forming.

Still another object of the present invention is to provide a method and device for producing a conductor circuit substrate (thick film conductor circuit) for use in an antenna of a non-contact ID, etc., with a very short curing time for the conductive paste, without producing unevenness, warping or wrinkling of the resin film substrate in the form of a web or the like, and with high productivity in a compact facility.

Yet another object of the present invention is to provide a non-contact ID and a production method for the same, which can be applied to a substrate having poor heat resistance and realize the mass production of the conductor circuit substrate because it requires a very short curing time in the conductor circuit production, and has reduced production costs.

A first aspect of the present invention provides an active energy beam curing type conductive paste (hereinafter referred simply as "conductive paste"), containing a conductive substance, and an active energy beam polymerizable compound, in which a cured matter, obtained when a composition of the paste excluding the conductive substance is cured with an electron beam having an acceleration voltage of 150 kV and an irradiated dose of 40 kGy, has an internal stress of 5 to 50 MPa. By using as the binder the composition (when no components in the paste except for the conductive substance are contained, it is the active energy beam polymerizable compound) that gives the cured matter (cured film) having the internal stress within the above-defined range when cured with an electron beam, the conductive paste of the present invention can form a circuit pattern having a suitable volume resistivity and excellent adhesiveness, even onto a substrate having poor thermal resistance. When two or more active energy beam polymerizable compounds are used, or a substance other than the active energy beam polymerizable compound is used, the mixture thereof should have the above defined internal stress.

Also, there is provided a conductive paste containing a conductive substance, and an active energy beam polymerizable compound, in which a cured matter, obtained when a composition of the paste excluding the conductive substance is cured with an electron beam having an acceleration voltage of 175 kV and an absorbed dose of 40 kGy, has a glass transition point of 0° C. to 200° C. By using as the binder the composition that gives a cured matter having the glass transition point within the above-defined range when cured with an electron beam, the conductive paste can form a circuit pattern having a suitable volume resistivity, excellent adhesiveness, high degree of hardness, and mechanical strength, even onto a substrate having poor thermal resistance. When two or more active energy beam polymerizable compounds are used, or a substance other than the active energy beam polymerizable compound is used, the mixture thereof should have the above defined glass transition point.

A second aspect of the present invention provides a method for producing a conductor circuit substrate, comprising the steps of: (a) forming a circuit pattern on a substrate using the above-mentioned conductive paste of the present invention, and (b) irradiating an active energy beam to the circuit pattern, and also provides thus produced conductor circuit substrate. According to this production method, the conductor circuit substrate having a suitable volume resistivity, and excellent hardness, strength, and adhesiveness to the substrate upon film forming can easily be mass-produced.

A third aspect of the present invention provides a method for producing a conductor circuit substrate, comprising the steps of: (I) forming a circuit pattern on a resin film substrate by printing a conductive paste containing a conductive substance and an active energy beam polymerizable compound with a rotary type printer, and (II) irradiating an active energy beam to the circuit pattern. The conductive paste is of an active energy beam curing type, and is cured in a very short time, whereby the resin film substrate can be transported at an increased speed, improving the productivity. The rotary type printer uses a very efficient printing method which is as efficient as printing a pattern onto fabric. Therefore, by printing the conductive paste, by using the rotary type printer, on the resin film substrate that is transported in a web form or the like, a sequential printing is possible, at a high speed and of a uniform quality.

A fourth aspect of the present invention provides a device for producing a conductor circuit substrate, comprising: a film unwinder for feeding a resin film substrate, a rotary type printer for printing a conductive paste containing a conductive substance and an active energy beam polymerizable compound on the resin film substrate provided, an irradiator for irradiating an active energy beam to a circuit pattern formed by the printing step, and a film winder for winding up the resin film substrate after irradiation.

A fifth aspect of the present invention provides a non-contact ID comprising a substrate, on which a circuit pattern and an IC chip are mounted; the circuit pattern being formed by a conductive paste containing a conductive substance and an active energy beam polymerizable compound. The non-contact ID uses the active energy beam curing type conductive paste, whereby a uniform conductor circuit can be formed without causing damage to the substrate, even if the substrate has poor thermal resistance. Thus, high quality non-contact ID with predetermined communication range properties can be obtained.

A sixth aspect of the present invention provides a method for producing a non-contact ID, comprising the steps of: (I) forming a circuit pattern on a resin film substrate by printing a conductive paste containing a conductive substance and an active energy beam polymerizable compound with a rotary type printer, (II) irradiating an active energy beam to the circuit pattern, and (III) mounting an IC chip on the resin film substrate. It is possible to produce non-contact ID in which the conductor circuit of uniform quality is formed continuously at high speed with high mass productivity and low costs using a compact facility.

BEST MODE FOR CARRYING OUT THE INVENTION

Figure 1:
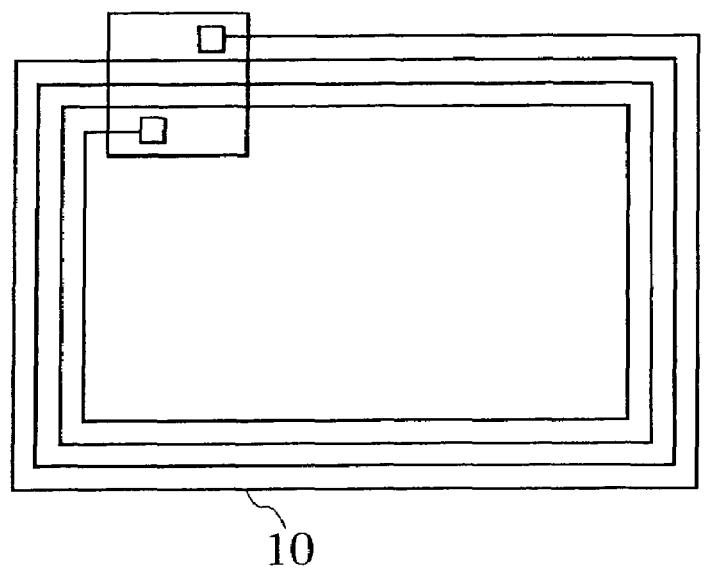
FIG. 1 is a plane view of an antenna conductor circuit (4 turn) in one embodiment of the conductor circuit substrate according to the present invention.

A composition consisting of the conductive paste of the present invention excluding the conductive substance is such that the cured matter obtained when the composition is cured with an electron beam having an acceleration voltage of 150 kV and an irradiated dose of 40 kGy, has an internal stress of 5 to 50 MPa, preferably 10 to 40 MPa. If the internal stress of the cured matter is less than 5 MPa, the conductive paste cannot provide the suitable volume resistivity. If the internal stress exceeds 50 MPa, the conductive paste has low adhesiveness with the substrate, and does not reach a practical use level.

The internal stress of the cured matter is measured as follows: On a non-deposited surface of an 12 μm aluminum deposited polyethylene terephthalate (hereinafter referred to as "PET"), the composition for the measurement of the internal stress is coated uniformly at a thickness of about 10 μm using a spin coater to form a film. Then, the coated matter is irradiated with an electron beam having an acceleration voltage of 150 kV and an irradiated dose of 40 kGy under nitrogen atmosphere to cure the film. Due to curing contraction, the resultant cured film on the aluminum deposited PET film curls in an arc so that the cured film is at inside, and the PET film is at outside. A deflection radius of curvature of the arc is measured.

An elastic modulus of the cured film on the aluminum deposited PET film is calculated using an elastic modulus of the PET film alone, and an elastic modulus of a combined film of the cured film and the PET film.

The internal stress (P0) of the cured film on the aluminum deposited PET film is calculated by the deflection radius of curvature (r: unit, mm), the elastic modulus of the substrate (F: unit, Pa), the elastic modulus of the cured film (E: unit, Pa), the thickness of the PET film (d1: unit, mm), and the thickness of the cured film (d2: unit, mm) using the following equation:

$$P0=2\{F\times(d1)^3+E\times(d2)^3\}/3r(d2)^2$$

In a preferred embodiment, the cured matter, obtained when the composition of the present invention excluding the conductive substance is cured with an electron beam having an acceleration voltage of 175 kV and an absorbed dose of 40 kGy, has a glass transition point of 0° C. to 200° C. If the glass transition point of the cured matter exceeds 200° C., initial conductivity and adhesiveness with the substrate are poor, and the conductive paste may not be used practically. If the glass transition point is less than 0° C, the cured film of the conductive paste has insufficient hardness and mechanical strength and may not be used practically, although sufficient conductivity would be provided. The glass transition point of the cured matter is more preferably 0° C. to 170° C., especially preferably 30° C. to 170° C.

The glass transition point of the cured matter is measured in accordance with the following method. The cured matter, obtained when the composition of the paste excluding the conductive substance is cured with an electron beam, is cut into a strip having a width of 5 mm and a length of 30 mm. The thickness of the sample is measured with a micrometer. The sample is measured for a storage elastic modulus (E') and a loss elastic modulus (E") as a function of a temperature with a dynamic viscoelasticity measuring device at a constant frequency of 10 Hz, a temperature of −50° C. to 200° C., and a temperature rising rate of 10° C. per minute. A loss tangent (tan δ) that is a ratio of E' to E" is plotted to the temperature. The temperature where an inflection point is attained is the glass transition point of the cured matter.

The active energy beam polymerizable compound is a compound polymerized by irradiating the active energy beam, and is preferably a compound having an ethylenic unsaturated group. Examples of the compound having an ethylenic unsaturated group include (meth)acrylic acid, (meth) acrylate compound, vinyl ether compound, and polyallyl compound. These compounds can be used alone or in combination of two or more thereof. The electron beam curing type conductive paste is cured using an electronic beam having strong permeability as a trigger. Even if it contains a large amount of conductive substances, the electron beam curing type conductive paste has higher curing property, for example, as compared with an ultraviolet ray curing type conductive paste, and is preferably used.

In the (meth)acrylate compound, examples of a monofunctional (meth)acrylate compound include methyl(meth)acrylate, ethyl(meth)acrylate, n-butyl(meth)acrylate, t-butyl (meth)acrylate, isobutyl(meth)acrylate, methoxydiethylene glycol(meth)acrylate, methoxytriethylene glycol(meth)acrylate, n-buthoxyethyl(meth)acrylate, 2-phenoxyethyl(meth) acrylate, cyclohexyl(meth)acrylate, tetrahydrofurfuryl (meth)acrylate, isobonyl(meth)acrylate, benzyl(meth) acrylate, 2-hydroxyethyl(meth)acrylate, 2-hydroxpropyl (meth)acrylate, 2-hydroxybutyl(meth)acrylate, 4-hydroxybutyl(meth)acrylate, (meth)acryloyloxyethyl hydrogen succinate, (meth)acryloyloxypropyl hydrogen phthalate, (meth)acryloyloxyethyl-2-hydroxypropyl phthalate, glycidyl(meth)acrylate, 2-hydroxy-3-acryloyloxypropyl(meth)acrylate, and the like.

Examples of a multifunctional (meth)acrylate compound include 1,6-hexanediol di(meth)acrylate, triethylene glycol di(meth)acrylate, tripropylene glycol di(meth)acrylate, neopentyl glycol di(meth)acrylate, ethylene oxide modified bisphenol A di(meth)acrylate, propylene oxide modified bisphenol A di(meth)acrylate, trimethylolpropane tri(meth) acrylate, ethylene oxide modified trimethylolpropane tri (meth)acrylate, propylene oxide modified trimethylolpropane tri(meth)acrylate, pentaerythritol tetra(meth)acrylate, ditrimethylolpropane tetra(meth)acrylate, dipentaerythritol hexa(meth)acrylate, pentaerythritol di(meth)acrylate, pentaerythritol tri(meth)acrylate, dipentaerythritol tetra(meth) acrylate, dipentaerythritol penta(meth)acrylate, urethane acrylate, epoxy acrylate, ester acrylate, and the like.

The use of three or more functional urethane acrylate of the multifunctional (meth)acrylate compounds listed above increase the curing contraction percentage, and decreases the volume resistivity, but does not decrease adhesiveness. Thus, an excellent active energy beam curing type conductive paste can be obtained.

For the vinyl ether compound, examples of a monofunctional vinyl ether compound include hydroxyethyl vinyl ether, hydroxybutyl vinyl ether, cyclohexane dimethanol monovinyl ether, cyclohexyl vinyl ether, and the like.

Examples of a multifunctional vinyl ether compound include a divinyl ether compound such as ethylene glycol divinyl ether, diethylene glycol divinyl ether, triethylene glycol divinyl ether, propylene glycol divinyl ether, dipropylene glycol divinyl ether, tripropylene glycol divinyl ether, neopentyl glycol divinyl ether, 1,4-butanediol divinyl ether, 1,6-hexanediol divinyl ether, glycerol divinyl ether, trimethylolpropane divinyl ether, 1,4-dihydroxycyclohexane divinyl ether, 1,4-dihydroxymethylcyclohexane divinyl ether, bisphenol A diethoxy divinyl ether, bisphenol S diethoxy divinyl ether, and the like.

Examples further include three or more functional polyvinyl ether compound such as glycerol trivinyl ether, sorbitol tetravinyl ether, trimethylolpropane trivinyl ether, pentaerythritol trivinyl ether, pentaerythritol tetravinyl ether, dipentaerythritol hexavinyl ether, dipentaerythritol polyvinyl ether, ditrimethylolpropane tetravinyl ether, ditrimethylolpropane polyvinyl ether, and the like.

Examples of the conductive substance for use in the conductive paste include metal powder such as gold, silver, copper, silver-plated copper powder, silver-copper combined powder, silver-copper alloy, nickel, chromium, palladium, aluminum, tungsten, molybdenum, platinum and the like; inorganic substance powder coated with these metals; metal oxide powder of silver oxide, indium oxide and the like; powder coated with these metal oxides; carbon black; graphite; and the like. Two or more of these conductive substances may be used in combination. Among the conductive substances, the silver powder is preferable, since it has high conductivity, and causes less increase in resistivity due to oxidation.

The conductive substance can be any shape of grain, ball, flake, scale, plate, branch, cube, and the like. In consideration of the contact of the conductive substances each other and the flowability of the conductive paste, the branch, scale or ball shape are preferable.

The conductive substance having an average diameter of 0.1 μm to 100 μm can be used. In view of the conductivity and the flowability of the conductive paste, it is preferable that the average diameter is of 1 μm to 50 μm, and more preferably 1 to 25 μm. The average diameter herein means a volumetric average diameter measured by a laser diffraction method.

The amount of the conductive substance is preferably 55% by weight or more in view of conductivity, and 95% by weight or less in view of strength and conductivity of the coated film formed, and more preferably 60 to 90% by weight, based on the conductive paste.

The conductive paste can contain a binder polymer to adjust paste viscosity, a film forming property, and properties of the cured coated film. As the binder polymer, a polymer having a polymerization degree of 10 to 10000, or having a number average molecular weight of $10^3$ to $10^6$ is preferable. The binder polymer may include a radical polymerizable ethylenic unsaturated group in the molecule. Examples include acrylic resin, polyester resin, alkyd resin, epoxy resin, polyvinyl resin, fluororesin, silicon resin, phenol resin, amino resin, polybutadiene resin, polyurethane resin, and the like. The resin may be reacted with (meth)acrylic acid, glycidyl (meth)acrylate, maleic anhydride, and the like so that an unsaturated group is introduced thereinto. The resin can be used alone or in combination of two or more thereof.

When the conductive paste is cured with an ultraviolet ray, a photoinitiator and a photoinitiator aid can be added to the conductive paste. Also, a solvent can be added to the conductive paste in order to adjust the viscosity. Examples of the solvent include ketones, aromatics, alcohols, cellosolves, ether alcohols, and esters. Two or more of these solvents may be used in combination.

Examples of the ketones include methylethylketone, methylisobutylketone, 3-pentanone, 2-heptanone, and the like. Examples of the aromatics include toluene, xylene, ethylbenzene, chlorobenzene, and the like. Examples of the alcohols include methanol, ethanol, isopropanol, normal butanol, isobutanol, ethylene glycol, propylene glycol, benzyl alcohol, and the like. Examples of the cellosolves include methyl cellosolve, ethyl cellosolve, butyl cellosolve, hexyl cellosolve, and the like. Examples of the ether alcohols include propylene glycol methyl ether, propylene glycol ethyl ether, propylene glycol butyl ether, and the like. Examples of the esters include ethyl acetate, butyl acetate, normal cellosolve acetate, butyl carbitol acetate, and the like.

The method for producing the conductor circuit substrate according to the present invention comprises the steps of (a) forming a circuit pattern on a substrate using the conductive paste of the present invention, and (b) irradiating an active energy beam to the circuit pattern. Using this method, the conductor circuit substrate on which the circuit pattern made of the conductor paste of the present invention is formed can be provided. That is, there is provided the conductor circuit substrate produced by the method for producing the conductor circuit substrate according to the present invention.

Figure 2:
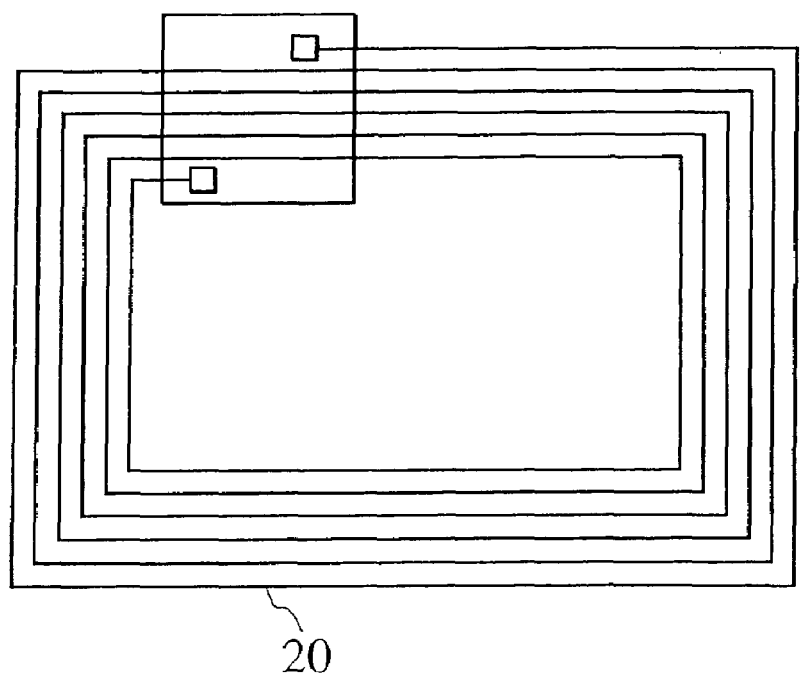
FIG. 2 is a plane view of an antenna conductor circuit (6 turn) in one embodiment of the conductor circuit substrate according to the present invention.

FIGS. 1 and 2 are plane views each showing an antenna conductor circuit according to one embodiment of the conductor circuit. FIG. 1 represents a 4 turn conductor circuit 10, and FIG. 2 represents a 6 turn conductor circuit 20, respectively.

As the substrate, an epoxy laminated plate, a paper-phenol substrate, paper, synthetic paper, a polyester film, a polyester alloy film, a polyphenylene sulfite film, a polycarbonate film, a polysulfone film, a polyether sulfone film, a polypropylene film, a vinyl chloride film, and the like can be used.

In the step (a), the circuit pattern can be formed by silk screen printing, rotary screen printing, offset printing, metal mask printing, and the like. In consideration of the thick film formation and the productivity, rotary screen printing is especially preferable.

In the step (b), an active energy beam is used as the trigger for curing the conductive paste, and examples thereof include an ultraviolet ray, an electron beam, a γ ray, an infrared ray, and a visible light. The electron beam is preferable from the viewpoint of the curing property reaching to the interior of the conductor circuit, and due to having less impact on the substrate on which the conductor circuit is formed.

It is preferable that the active energy beam be irradiated under the conditions so that the cured matter, obtained when the composition of the paste excluding the conductive substance is cured, has the internal stress of 5 to 50 MPa. Also, it is preferable that the active energy beam be irradiated under the conditions so that the cured matter, obtained when the composition of the paste excluding the conductive substance is cured, has the glass transition point of 0° C. to 200° C.

When the electron beam is used as the active energy beam, the desired electron beam can be obtained by an electron beam irradiating device having an accelerating voltage preferably in the range of 100 to 1000 kV, and more preferably in the range of 150 to 250 kV, from the viewpoint of sufficient curing reaching to the interior of the conductor circuit and damage to the substrate. An irradiated dose of the electron beam is preferably in the range of 1 to 1000 kGy, and more preferably in the range of 5 to 200 kGy from the viewpoint of sufficient curing reaching to the interior of the conductor circuit and damages to the substrate.

An absorbed dose of the electron beam is determined as follows: A film for measuring the dose ("RADIACHROMICFILMFWT-60-00" having a thickness of 44.5 μm, available from FARWEST Corp.) is irradiated with a standard radiation source (Co60 gamma ray) to determine correlation of the irradiated dose with absorbance of the film. Then, the irradiated dose of the film irradiated with the standard radiation source by which the irradiated film has the same absorbance as a colored film irradiated with the electron beam is to be the absorbed dose of the electron beam.

After curing with the active energy beam irradiation, it is preferable that the conductive paste is heated at 120° C. or more for about 2 minutes in step (c) of applying heat and pressure. The resistivity value of the conductor circuit can thereby be decreased. However, heating at 120° C. or more may deform substrates with poor thermal resistance, and therefore is difficult to apply. In the method for producing the conductor circuit substrate using the conductive paste of the present invention, it is preferable that pressure is applied while heating at about 80° C. to 100° C. A combination of applying both heat and pressure can promote the orientation of the conductive substance and decrease the resistivity value at about 80° C. to 100° C. at which the substrate is not deformed. If the temperature is less than 80° C., the orientation of the conductive substance for decreasing the resistivity value is insufficiently promoted. It is not preferable that the temperature exceeds 100° C., because substrates with very poor thermal resistance may be deformed. The pressure can be applied with a roll, and is preferably 5 to 20 kgf/cm, and more preferably 8 to 12 kgf/cm. If the pressure is under 5 kgf/cm, the orientation of the conductive substance for decreasing the resistivity value is insufficiently promoted. If the pressure exceeds 20 kgf/cm, the productivity is unfavorably lowered.

Figure 3:
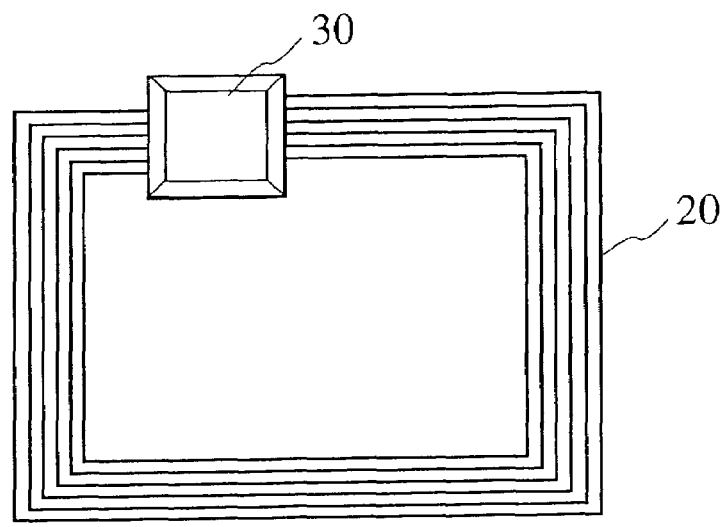
FIG. 3 is a plane view of one embodiment of a non-contact ID according to the present invention.

The non-contact ID according to the present invention comprises a substrate, on which a circuit pattern and an IC chip are mounted; the circuit pattern being formed by a conductive paste containing a conductive substance and an active energy beam polymerizable compound. The non-contact ID can be obtained by, for example, mounting the IC chip on the conductor circuit substrate manufactured by the above-mentioned method, or by the method for producing the non-contact ID according to the present invention as will be described later. A plurality of IC chips may be mounted on the substrate. Preferably, the circuit pattern can be formed using the conductive paste of the present invention. FIG. 3 is a plane view showing part of the non-contact ID in a preferred embodiment. The IC chip 30 is mounted on the conductor circuit 20.

The substrate holds the conductor circuit and the IC chip, and is made of paper and a film similar to the substrate of the conductor circuit. The IC chip is for memorizing, storing, and computing data.

A dried film thickness of the circuit pattern formed is preferably 10 to 200 µm from the viewpoint of the circuit resistivity value, and curing properties. If the film thickness is less than 10 µm, there is a little chance of contacting the conductive substances with each other in the film thickness direction, and the volume resistivity is prone to vary widely. As a result, the circuit resistance may be unstable. If the film thickness exceeds 200 µm, the active energy beam may not reach the inside of the conductor circuit, which may be uncured.

The non-contact ID is an RFID (Radio Frequency Identification), a non-contact type IC card, a non-contact type IC tag, a data carrier (recording medium), or a wireless card, and uses a radio wave for identifying individual or for transmission/reception of data between a reader or a reader writer. The non-contact ID is applicable to settlement of a fee collection system, a financial management system, etc.; ID management and history management of a room entering/leaving management system, a medical management system, etc.; position management of a road utilization and congestion management system, a freight and baggage tracking and management system, etc.

Figure 4:
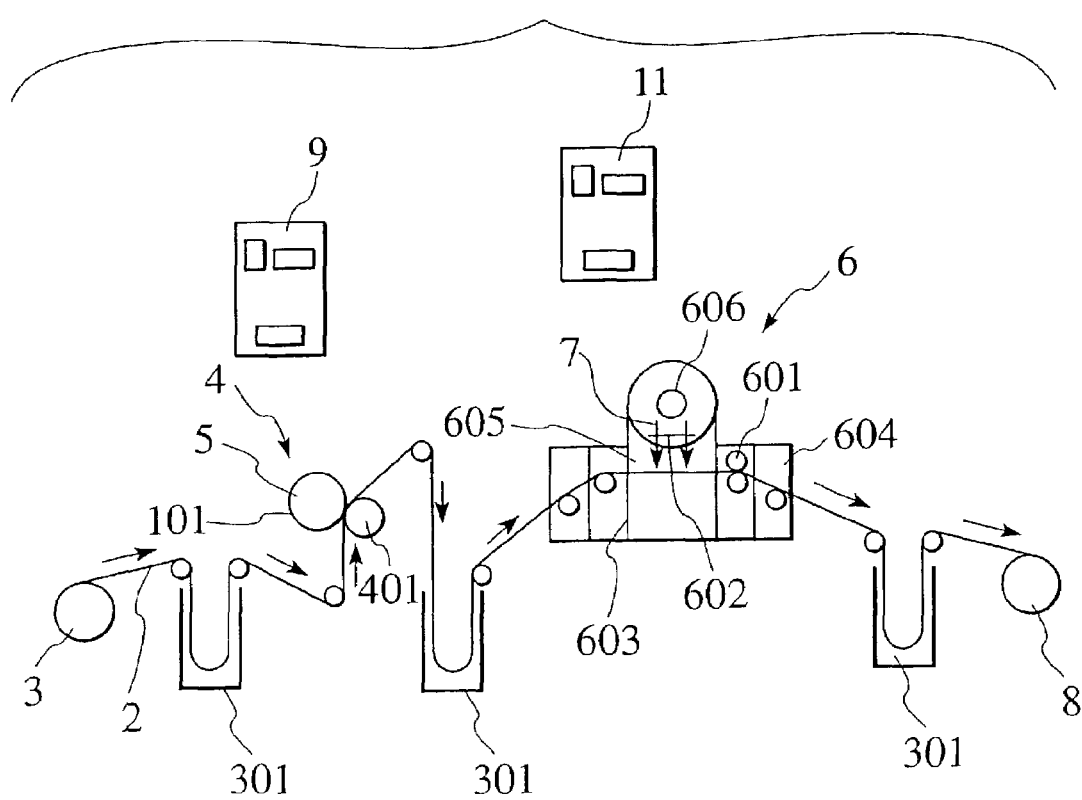
FIG. 4 is a schematic diagram showing one embodiment of a conductor circuit forming device line.

Referring to the Figures, there will be described a method for producing the conductor circuit substrate according to the present invention, comprising the steps of: (I) forming a circuit pattern on a resin film substrate by printing a conductive paste containing a conductive substance and an active energy beam polymerizable compound with a rotary type printer, and (II) irradiating an active energy beam to the circuit pattern; and a device for producing a conductor circuit substrate, comprising: a film unwinder for feeding a resin film substrate, a rotary type printer for printing a conductive paste containing a conductive substance and an active energy beam polymerizable compound on the resin film substrate provided, an irradiator for irradiating an active energy beam to a circuit pattern formed by the printing step, and a film winder for winding up the resin film substrate after irradiation. FIG. 4 is a schematic diagram showing one embodiment of the conductor circuit forming device line.

For example, a web-like resin film substrate 2 is used as the substrate, and is sequentially fed from a film unwinder 3. On the substrate 2 provided, a conductive paste (i.e., electron beam curing silver paste) 5 is printed with a rotary type printer 4. The rotary type printer 4 is equipped with a screen 101 and a press roller 401 that face each other. The rotary type printer can print effectively and sequentially. Planographic printing, intaglio printing, and screen printing can be exemplified. In this step, a screen type printer (rotary screen printer) equipped with a cylindrical screen 101 is most suitable, since the conductive paste is well removed from the plate, the film can be thicker, and the conductor circuit with low resistivity can be formed.

Then, the printed circuit pattern is irradiated with the active energy beam using an active energy beam irradiating device. The active energy beam is preferably the electron beam. The electron beam irradiating device 6 is structured such that it heats a filament 606 under vacuum atmosphere to produce thermoelectrons, and the thermoelectrons are accelerated using a potential difference to permeate through an irradiating window 602 made of Ti metal, whereby electron beams 7 are irradiated to a chamber 604. In an irradiating part, a nitrogen gas seal 605 is attached to inhibit ozone production, and an X-ray shielding partition 603 is disposed to prevent that the X-ray leaks outside of an X-ray chamber. In the conventional method, the paste is cured by heating for a long time with a long hot air circulation oven. In contrast, the present invention has a feature in that an electron beam curing silver paste 5 is cured by the electron beam irradiation. The conventional heat curing produces unevenness, warping and wrinkling on the resin film substrate, and the electrodes are significantly displaced. It requires therefore extra time to align the electrodes individually upon bonding, and the antenna conductor circuit may be broken. Thus, there are problems with productivity and quality. Alternatively, in the UV irradiating method, the UV ray has low energy, which requires adding the photoinitiator and the photoinitiator aid specially. Since the UV ray is light, a shadow part is not irradiated defectively to cause irregular curing. In contrast, the electron beam irradiating method is preferable in that the conductive paste 5 can be cured in a very short time without applying heat to the resin film substrate. Most suitable electron beam irradiating device is an area beam type, which irradiates a wide and uniform beam.

The substrate 2 irradiated with the active energy beam is transported by a driven roller 601, and wound up by a film winder 8.

In order to attain a stable operation through the sequence of web unwinder, the rotary screen printer, the area beam type electron beam irradiating device, and the web winder, it is preferable that a buffer device 301 is disposed in a practical line to absorb minor speed differences in the web transportation in the respective devices and to keep web transportation tension in the respective devices small and reasonable. Thus, any sagging of the substrate between the respective devices can be absorbed.

It is also preferable that controllers 9, 11 control the web unwinder, the screen 101 of the rotary screen printer 4, and the driven roller 601 of the electron beam irradiating device 6 so that the rotary screen printer 4 and the area beam electron beam irradiating device 5 are operated synchronously. The dose of the electron beam irradiation can be kept uniform even when the web transportation speed rises or falls and the printing conditions are changed, thereby the level of the cure in the web length direction can be uniform, and the quality can be stabilized.

Figure 5:
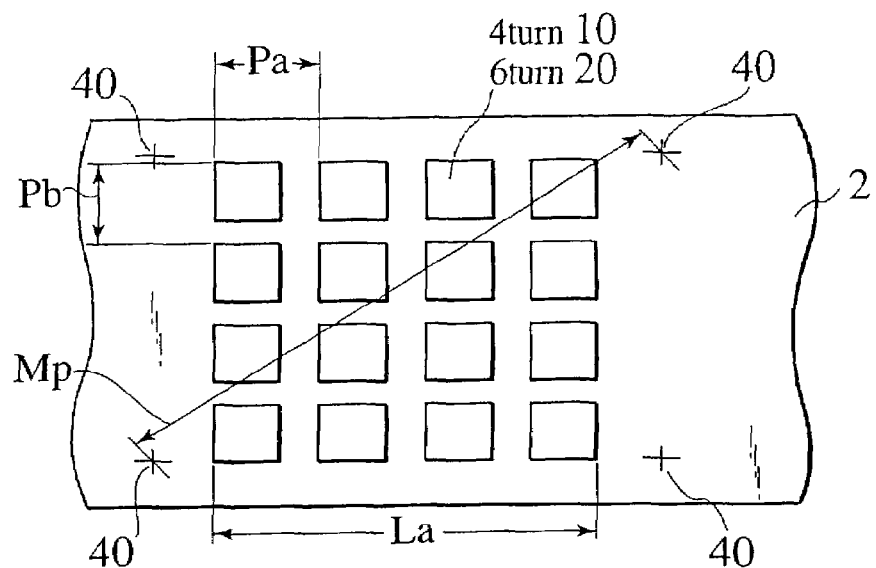
FIG. 5 is a plane view showing one embodiment of screen printing on a resin film substrate.

FIG. 5 is a plane view showing one embodiment of screen printing on the resin film substrate. Antenna conductor circuits 10, 20 are printed on the resin film substrate 2 in an arrangement of 4×4. Cross alignment marks 40 are concurrently printed at four corners.

According to the method for producing the conductor circuit substrate, the conductive paste is cured by irradiating the active energy beam for a short time as described above. The resin film substrate is not heated so that the method is advantageously applicable to the resin film substrate having a thermal resistance of 150° C. or less, to which the heat curing type conductive paste is difficult to apply.

Examples of such resin film substrate include
polyester alloy film: softening point of 80° C. to 120° C.
polyester film: glass transition point of 70° C. to 85° C.
polyvinyl chloride film: softening point of 70° C. to 80° C.
polyphenylene sulfide film: glass transition point of 90° C.
polycarbonate film: glass transition point of 150° C.
polysulfone film: glass transition point of 190° C.
polyethersulfone film: glass transition point of 225° C.

In particular, this method is extremely effective for polyester alloy film, polyester film, polyvinyl chloride film, polyphenylene sulfide film, polycarbonate film and the like, as all have low softening points and glass transition points.

In a preferred embodiment, the above described resin film substrate having the thermal deformation temperature of 150° C. or less is irradiated with the electron beam having 75 kV to 300 kV for 0.02 seconds to 1 second. If the duration of irradiating the electron beam extends some seconds, the resin film substrate may be deteriorated by the electron beam.

In another preferred embodiment, the conductive paste is a conductive paste in which the cured matter has a predetermined range of internal stress according to the present invention, or a conductive paste in which the cured matter has a predetermined range of glass transition point according to the present invention.

Figure 6:
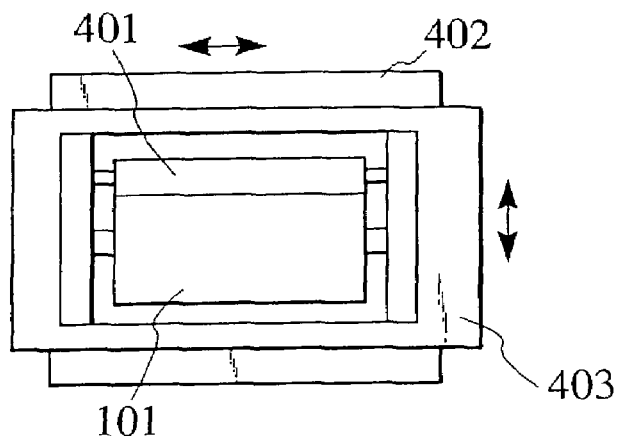
FIG. 6 is a schematic plane view showing one embodiment of a rotary screen printer.
Figure 7:
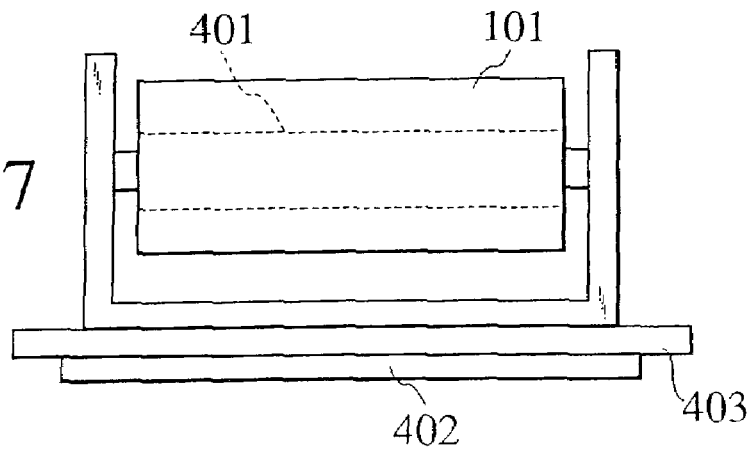
FIG. 7 is a schematic front view showing one embodiment of a rotary screen printer.

There will be described a method and device designed for precise printing at a predetermined position of the web-like resin film substrate that is fed sequentially using the rotary screen printer. FIG. 6 is a schematic plane view showing one embodiment of the rotary screen printer. FIG. 7 is a schematic front view thereof.

The rotary screen printer 4 shown in FIG. 6 comprises an X stage 402 and a Y stage 403 for controlling movements of a screen 101 and a press roller 401 in an X axis and a Y axis (moving direction). A position difference between a recognition mark provided on the film substrate in advance and a printed pattern is detected by a camera. The screen 101 and the press roller 401 are moved smoothly in the X and Y axes directions to correct the difference. Thus, a next pattern can be printed on the pattern of the film substrate formed in advance with a precise relative position.

In another embodiment, a film substrate end face controlling device is disposed at a side of the film substrate transporting device in the X axis direction, thereby enabling the adjustment of the printing position in the X axis direction. In still another embodiment, in the Y axis direction, the printing position can be adjusted by increasing or decreasing the rotating number of the screen so that actual film feed accords with a moving distance detected by a plurality of recognition marks.

In either cases, a combination of the position correcting device in the X and Y axes directions and the buffers 301 disposed at the front and the back of the printer enables easy printing at the predetermined position. The position correcting device herein is not limited to the rotary type screen printer, and also applicable to a planographic printing or intaglio printing type rotary printer.

In yet another embodiment, a preheating oven with hot air or infrared ray is disposed between the printer and the active energy beam irradiating device to heat at a temperature not more than the glass transition point or the softening point of the film substrate. By disposing the preheating oven, the resistivity value of the printing circuit can be decreased.

According to the present invention, the method for producing the conductor circuit substrate comprising the steps of (I) and (II) further includes the step (III) of mounting an IC chip on the resin film substrate. The method is preferably used as the production method of the non-contact ID.

The IC chips are mounted on the resin film substrate by aligning with an alignment mark printed on the substrate using the bonding device to bond the IC chips at the predetermined position. For example, when the resin film substrate has a width of about 300 mm, two printed alignment marks are image-processed to align. When the resin film substrate has a width of 500 mm or more, all alignment marks in the four corners are preferably image-processed to align. When the resin film substrate has a width of 300 mm or less, it is convenient that reference holes are disposed at both sides of the resin film substrate, and a positioning guide pin is used to align, upon printing the antenna conductor circuit with the rotary screen printer.

As described above, the conductive paste of the present invention can be applicable to the substrate having poor heat resistance, and can provide the conductor circuit substrate having an appropriate volume resistivity, and being excellent in hardness, strength, and adhesiveness to the substrate. Also, curing requires very short time in the production of the conductor circuit, whereby mass production of the conductor circuit substrate can be improved, and production costs can be reduced.

The non-contact ID of the present invention can be applicable to the substrate having poor heat resistance. Also, curing requires very short time in the production of the conductor circuit, whereby mass production of the conductor circuit substrate can be realized, production costs can be reduced, while high quality is obtained.

The method and device for the conductor circuit substrate of the present invention comprising the steps (I) and (II) are intended so that the conductor circuit substrate can suitably be used as the non-ID antenna and the like. The time required for curing the conductive paste is significantly decreased, no unevenness, warping and wrinkling are produced on the resin film substrate in the web form and the like, and high productivity can be obtained in a compact facility. Specifically, when the active energy beam curing type conductive paste is cured by irradiating the active energy beam for a short time, adverse effects on the resin film substrate due to heat can be avoided, as compared with the conventional thermal drying or curing using the heat curing type paste. Also, extremely significant advantages can be obtained such as (1) improvement of the transportation speed by as much as 20 times, (2) space saving of the device for curing the paste of the conductor circuit by as much as 1/15 length, (3) no unevenness, warping and wrinkling and a shortened time required for alignment upon bonding, and (4) the improvement of the quality of the non-contact ID card or the non-contact ID tag, etc.

EXAMPLE

The present invention is further illustrated in the non-limiting examples set forth below. In the examples, all parts are by weight.

A. Conductive Paste

Examples 1 to 4, Comparative Examples 1 to 2

(1) Preparation of Conductive Paste

Respective components shown in Table 1 were premixed by a precession mill, and kneaded with three rolls to prepare respective conductive pastes.

(2) Production of Conductive Circuit

Each conductive paste was screened through a 200 mesh stainless steel screen on a corona-treated PET substrate to form each circuit pattern. The electron beam was irradiated thereto using an area beam type electron beam irradiating device "Curetron EBC-200-20-30" (manufactured by Nissin High Voltage, Co., Ltd.) under the conditions that an acceleration voltage is 175 kV and an irradiated dose is 40 kGy to provide a conductor circuit.

Comparative Example 3

A conductive paste was prepared, and a circuit pattern was formed on a PET substrate as described in EXAMPLE 1. An ultraviolet ray was irradiated thereto from a distance of 20 cm using two 120 W metal halide lamps to provide a conductor circuit.

Comparative Example 4

91.3 parts of bisphenol F diglycidyl ether ("RE-404S" manufactured by Nippon Kayaku Co., Ltd.), 39.1 parts of resorcyl glycidyl ether ("Denacol EX-201" manufactured by Nagase Chemicals Ltd., 21.9 parts of dicyanediaminde ("AH-154" manufactured by Ajinomoto Co., Inc.), 794.8 parts of silver powder "SF-65" and 53.0 parts of n-butyl cellosolve acetate (reagent grade: special, manufactured by Tokyo Kasei Co., Ltd.) were premixed by a precession mill, and kneaded with three rolls to prepare a conductive paste. A circuit pattern was formed on the substrate using the conductive paste as described in EXAMPLE 1, heated at 180° C. for 30 minutes using a box oven and cured to provide a conductive circuit.

Example 5

A conductive paste was prepared, and a circuit pattern was formed on the PET substrate as described in EXAMPLE 1. The electron beam was irradiated thereto under the same conditions as those in EXAMPLE 1. The pressure and heat were applied with a heating and pressure roll under the conditions that a temperature was 100° C. and a pressure was 10 kgf/cm to provide a conductor circuit.

Example 6

A conductor circuit was provided in the same manner as in EXAMPLE 5 except that the temperature was 25° C. in the heating and pressure application step.

Examples 7 to 12, Comparative Examples 5 to 9

(1) Preparation of Conductive Paste

Respective components shown in Tables 2 and 3 were premixed by a precession mill, and kneaded with three rolls to prepare respective conductive pastes.

(2) Production of Conductive Circuit

Each conductive paste was screened through a silk screen (screen mesh #230, linear 23 μm) on a glass epoxy substrate on which four copper electrodes were disposed at intervals of 20 mm, and was printed so that the electrodes were connected by a circuit having a width of 3 mm. The electron beam was irradiated thereto to form each conductive circuit as described in the above-mentioned EXAMPLES.

The resultant conductor circuits were evaluated regarding the following.

[Internal Stress]

In accordance with the method for measuring the internal stress of the present invention as described above, an internal stress of each cured film was measured. A deflection radius of curvature was measured using a laser displacement measurement device.

[Glass Transition Point]

In accordance with the method for measuring the glass transition point of the present invention as described above, a glass transition point of the cured matter was measured. A dynamic viscoelasticity measuring device, "DVA-200" manufactured by I T Keisoku Seigyo KK was used.

[Volume Resistivity]

Each conductive paste was screened through a silk screen (screen mesh #230, linear 23 μm) on a glass epoxy substrate on which four copper electrodes were disposed at intervals of 20 mm, and was printed so that electrodes were connected by a circuit having a width of 3 mm. The electron beam was irradiated thereto to cure it. Resistivity between electrodes was measured using a four probe method of the resistivity measurement device. The thickness of the circuit was measured using a thickness meter. The volume resistivity was calculated based on the resultant resistivity, electrode distance, circuit width, and circuit thickness.

[Adhesiveness]

Each conductive paste was applied on a polyester alloy film at a thickness of about 30 μm using an edge coater in EXAMPLES 1 to 6 and COMPARATIVE EXAMPLES 1 to 4, and with a screen printing in EXAMPLES 7 to 12 and COMPARATIVE EXAMPLES 5 to 9, and subsequently was cured with an electron beam. The cured film was crosscut with a cutter knife to conduct a cellophane-tape removing test.

[Scratch Resistance]

Each conductive paste was applied at a thickness of about 30 μm by a screen printing on a polyester alloy film, and then cured with an electron beam. The resultant cured film was scratched with a nail to visually evaluate the degree of scratching.

[Effects on Substrate]

The resultant conductor circuit was visually inspected for deformation, coloring, and cracking of the substrate.

Tables 1 to 3 show the compositions of the conductive paste prepared in EXAMPLES and COMPARATIVE EXAMPLES, and evaluation results. In the tables, the compounds are as follows:

[Active Energy Beam Polymerizable Compound]

BS575: hexafunctional urethane acrylate (Beam Set 575 manufactured by Arakawa Chemical Industries Ltd.)

UA-306H: hexafunctional urethane acrylate (manufactured by Kyoeisha Chemical Co., Ltd.)

DPHA: dipentaerythritol hexaacrylate

BADGDA: bisphenol A diglycidyl ether diacrylate

HX-620: bifunctional ester acrylate (manufactured by Nippon Kayaku Co., Ltd.)

4-HBA: 4-hydroxybutyl acrylate

TPGDA: tripropylene glycol diacrylate

2-EtHx: 2-ethylhexyl acrylate

2-MeOEt: 2-methoxyethyl acrylate

BA: n-butyl acrylate

HEA: 2-hydroxyethyl acrylate

IBA: isobornyl acrylate

MA: methacrylic acid

4-EGA: tetraethylene glycol diacrylate

HDDA: 1,6-hexanediol diacrylate

NPGDA: neopentyl glycol diacrylate

TMPTA: trimethylolpropane triacrylate

[Binder Polymer]

RV550: saturated polyester resin (Vylon RV550 having a glass transition point of −16° C. and a number average molecular weight of 25,000 to 30,000 manufactured by Toyobo Co., Ltd.)

BR117: thermoplastic acrylic resin (Dianal BR117 having a glass transition point of 95° C. and a number average molecular weight of 150,000 manufactured by Mitsubishi Rayon Co., Ltd.)

RV600: saturated polyester resin (Vylon RV600 having a glass transition point of 45° C. and a number average molecular weight of 17,000 to 20,000 manufactured by Toyobo Co., Ltd.)

RV300: saturated polyester resin (Vylon RV300 having a glass transition point of 10° C. and a number average molecular weight of 22,000 to 25,000 manufactured by Toyobo Co., Ltd.)

[Conductive Substance]

SF-65: scaled silver powder (manufactured by Degussa Japan Co., Ltd., having an average particle size of 2.5 μm)

AA-0014: scaled silver powder (manufactured by Kemet electronic Corp, having an average particle size of 2.5 μm)

[Photoinitiator]

Irg907: 2-methyl-1 [4-(methylthio)phenyl]-2-morpholinopropane-1-one (manufactured by Chiba specialty chemicals K.K.)

TABLE 1

|  | Example 1 | Example 2 | Example 3 | Example 4 | Example 5 | Example 6 | Comp. Ex. 1 | Comp. Ex. 2 | Comp. Ex. 3 | Comp. Ex. 4 |
|---|---|---|---|---|---|---|---|---|---|---|
| Conductive Substance | SF-65 | SF-65 | SF-65 | SF-65 | SF-65 | SF-65 | SF-65 | SF-65 | SF-65 | — |
| Parts by weight of CS | 80 | 85 | 75 | 80 | 80 | 80 | 80 | 75 | 80 | — |
| Polymerizing Compound 1 | BS575 | UA-306H | DPHA | BADGDA | BS575 | BS575 | BADGDA | DPHA | BS575 | — |
| Polymerizing Compound 2 | TPGDA | TPGDA | TPGDA | TPGDA | TPGDA | TPGDA | HX-620 | TPGDA | TPGDA | — |
| Polymerizing Compound 3 | 4-HBA | 4-HBA | 4-HBA | 4-HBA | 4-HBA | 4-HBA | 4-HBA | 4-HBA | 4-HBA | — |
| Parts by weight of PC 1 | 65.0 | 65.0 | 65.0 | 65.0 | 65.0 | 65.0 | 65.0 | 80.0 | 65.0 | — |
| Parts by weight of PC 2 | 17.5 | 17.5 | 17.5 | 17.5 | 17.5 | 17.5 | 17.5 | 10.0 | 17.5 | — |
| Parts by weight of PC 3 | 17.5 | 17.5 | 17.5 | 17.5 | 17.5 | 17.5 | 17.5 | 10.0 | 17.5 | — |
| Photoinitiator | — | — | — | — | — | — | — | — | Irg907 | — |
| Parts by weight of PI | — | — | — | — | — | — | — | — | 5.0 | — |
| Heating and pressure roller processing | Not done | Not done | Not done | Not done | Done | Done | Not done | Not done | Not done | Not done |
| Heat processing | Not done | Not done | Not done | Not done | Done | Not done | Not done | Not done | Not done | Not done |
| Internal stress (Mpa) | 30.5 | 28.3 | 35.1 | 21.8 | 30.5 | 30.5 | 3.3 | 62.1 | 27.5 | ? * |
| Grass transition point(° C.) | 168.5 | 172.5 | 183.4 | 159.5 | 168.5 | 168.5 | 102.1 | >250 | 162.3 | — |
| Volume resistivity (Ω · cm) | 3.0 × 10⁻⁴ | 3.5 × 10⁻⁴ | 2.5 × 10⁻⁴ | 5.5 × 10⁻⁴ | 1.9 × 10⁻⁴ | 2.8 × 10⁻⁴ | 5.0 × 10⁻³ | 2.4 × 10⁻⁴ | 6.2 × 10⁻³ | ? * |
| Adhesiveness | Good | Good | Good | Good | Good | Good | Good | Bad | Good | ? * |
| Effects on substrate | None | None | None | None | None | None | None | None | None | Deformed |

CS: Conductive Substance PC: Polymerizing Compound PI: Photoinitiator
*: Unmeasurable due to deformed substance

TABLE 2

|  | Example 7 | Example 8 | Example 9 | Example 10 | Example 11 | Example 12 |
|---|---|---|---|---|---|---|
| Conductive Substance | AA-0014 | AA-0014 | AA-0014 | AA-0014 | AA-0014 | AA-0014 |
| Parts by weight of CS | 85 | 83 | 86 | 81 | 87 | 85 |
| Polymerizing Compound 1 | UA306H | UA306H | BS575 | — | — | — |

TABLE 2-continued

|  | Example 7 | Example 8 | Example 9 | Example 10 | Example 11 | Example 12 |
|---|---|---|---|---|---|---|
| Polymerizing Compound 2 | HDDA | NPGDA | TPGDA | HDDA | NPGDA | NPGDA |
| Polymerizing Compound 3 | 4-HBA | HEA | 4-HBA | — | 4-HBA | 4-HBA |
| Binder Polymer | — | — | — | BR117 | RV600 | RV300 |
| Parts by weight of PC 1 | 30.0 | 30.0 | 50.0 | — | — | — |
| Parts by weight of PC 2 | 35.0 | 35.0 | 32.5 | 80.0 | 60.0 | 30.0 |
| Parts by weight of PC 3 | 35.0 | 35.0 | 17.5 | — | 20.0 | 50.0 |
| Parts by weight of BP | — | — | — | 20.0 | 20.0 | 20.0 |
| Internal stress (Mpa) | 30.4 | 34.8 | 32.5 | 30.8 | 24.3 | 28.1 |
| Grass transition point (° C.) | 159.4 | 168.4 | 192.6 | 65.8 | 57.9 | 23.4 |
| Volume resistivity (Ω · cm) | $1.8 \times 10^{-4}$ | $1.9 \times 10^{-4}$ | $2.8 \times 10^{-4}$ | $3.21 \times 10^{-4}$ | $2.4 \times 10^{-4}$ | $3.8 \times 10^{-4}$ |
| Adhesiveness | Good | Good | Good | Good | Good | Good |
| Scratching resistance | Good | Good | Good | Good | Good | Good |

CS: Conductive Substance PC: Polymerizing Compound BP: Binder polymer

TABLE 3

|  | Comp. Ex. 5 | Comp. Ex. 6 | Comp. Ex. 7 | Comp. Ex. 8 | Comp. Ex. 9 |
|---|---|---|---|---|---|
| Conductive Substance | AA-0014 | AA-0014 | AA-0014 | AA-0014 | AA-0014 |
| Parts by weight of CS | 85 | 86 | 85 | 85 | 84 |
| Polymerizing Compound 1 | — | — | — | DPHA | TMPTA |
| Polymerizing Compound 2 | 4-EGA | TPGDA | — | — | — |
| Polymerizing Compound 3 | 2-EtHx | 2-MeOEt | BA | IBA | MA |
| Binder Polymer | — | — | RV550 | — | — |
| Parts by weight of PC 1 | — | — | — | 50.0 | 50.0 |
| Parts by weight of PC 2 | 10.0 | 10.0 | — | — | — |
| Parts by weight of PC 3 | 90.0 | 90.0 | 80.0 | 50.0 | 50.0 |
| Parts by weight of BP | — | — | 20.0 | — | — |
| Internal stress (Mpa) | 8.7 | 9.5 | 7.4 | 54.3 | 56.2 |
| Grass transition point (° C.) | −5.3 | −13.1 | −8.3 | >250 | >250 |
| Volume resistivity (Ω · cm) | $5.4 \times 10^{-4}$ | $4.2 \times 10^{-4}$ | $7.6 \times 10^{-4}$ | $3.1 \times 10^{-3}$ | $2.7 \times 10^{-3}$ |
| Adhesiveness | Good | Good | Good | Bad | Bad |
| Scratching resistance | Bad | Bad | Bad | Good | Good |

CS: Conductive Substance PC: Polymerizing Compound BP: Binder polymer

B. Production Method for Conductive Circuit Substrate

Example 13

A web-like polyester alloy film substrate was continuously fed from a web unwinder. An electron beam curing silver paste with a binder containing an acrylic resin was printed using a rotary screen printer to provide a conductor circuit 10 having an average thickness of 30 µm as shown in FIG. 5. Then, the conductor circuit was fed into an electron beam irradiating device to irradiate it with an electron beam having an acceleration voltage of 200 kV and an irradiated dose of 40 kGy.

The antenna conductor circuit 10 removed from the electron beam irradiating device had resistance of 40 Ω. The electron beam was irradiated for 0.12 seconds, since a transportation speed of each resin film substrate in an irradiating part was 20 m/min, and a length of the irradiated area was 40 mm. As described in COMPARATIVE EXAMPLE 10, the transportation speed was 1 m/min, and the length of the hot air circulation oven was 30 m in the heat curing. In contrast, although the transportation speed was 20 m/min, which was 20 times greater, the electron irradiating device could have the length of 2 mm, which was 1/15 of the length of the hot air circulation oven, whereby the space of the device could significantly be saved.

Since the time for irradiating the resin film substrate with the electron beam was very short, at 0.12 seconds, an increase in temperature was not observed at all. As a result, the resin film substrate taken out after the electron irradiation did not have unevenness, warping or wrinkling at all. A distance error between an alignment mark 40 on the resin film substrate printed by the rotary screen printer and an electrode position of the antenna conductor circuit 10 was measured. The error was ±0.05 mm or less.

The resin film substrate was mounted on a bonding device to image process two of the printed alignment marks 40 at four corners, the electrode position of each antenna conductor circuit 10 was determined to bond IC chips. As a result, it was proved that each resin film substrate had a communication distance of the predetermined 60 mm to 80 mm as a non-contact ID card. A required time to image process and align the alignment mark was just a recognition time and a computing time of the two alignment marks. As compared with 28 seconds in COMPARATIVE EXAMPLE 10, the total time was significantly decreased to as short as 4 seconds. A gold stud bump was used as the bump of the IC chip, and for connection an ACF (anisotropic conductive film) was used, and both were heated for 5 seconds to be cured.

Example 14

A web-like polyester alloy film substrate material having a width of 300 mm was continuously fed from a web unwinder. An electron beam curing silver paste with a binder containing an acrylic resin was printed using a rotary screen printer to provide a conductor circuit 20 having an average thickness of 20 µm as shown in FIG. 2. Then, in an electron beam irradiating device, the electron beam having an acceleration voltage of 150 kV and an irradiated dose of 20 kGY was irradiated thereto. The antenna conductor circuit 20 removed from the electron beam irradiating device had resistance of 60 Ω. The electron beam was irradiated for 0.24 seconds, since a transportation speed of the resin film substrate in each irradiating part was 10 m/min, and a length of the irradiated area was 40 mm. As described in COMPARATIVE EXAMPLE 10, the transportation speed was 1 m/min, and the length of the hot air circulation oven was 30 m in the heat curing. In contrast, although the transportation speed was 10 m/min, which was 10 times greater, the electron irradiating device could have the length of 2 m, which was 1/15 of the length of the hot air circulation oven, whereby the space of the device could significantly be saved.

As compared with 0.12 seconds of a residence time of the resin film substrate in the electron beam irradiating device in EXAMPLE 13, the residence time was doubled, i.e., 0.24 seconds. However, an increase in temperature was not observed at all. As a result, the resin film substrate after the electron irradiation did not have any unevenness, warping or wrinkling at all.

A distance error between an alignment mark 40 on the resin film substrate printed by the rotary screen printer and an electrode position of the antenna conductor circuit 20 was measured. The error was ±0.05 mm or less, which was similar to the EXAMPLE 13.

The resin film substrate was mounted on a bonding device to image process two of the printed alignment marks 40 at four corners, the electrode position of each antenna conductor circuit was determined to bond IC chips in the same manner as in EXAMPLE 13. As a result, it was proved that each resin film substrate had a communication distance of the predetermined 100 mm to 120 mm as a non-contact ID card. The time required to image process and align the alignment mark was just a recognition time and a computing time of the two alignment marks. As compared with 28 seconds in COMPARATIVE EXAMPLE 10, the total time was significantly decreased to as short as 4 seconds. A gold stud bump was used as the bump of the IC chip, and for connection an epoxy resin anisotropic conductive paste containing conductive particles having an average size of 4 μm was used, and both were heated for 10 seconds to be cured.

In the same manners as in EXAMPLES 13 and 14, conductor circuits were produced having printed thicknesses of 10 μm in EXAMPLES 15 and 50 μm in EXAMPLES 16.

The conditions for irradiating the electron beam in EXAMPLES 13 to 16 are summarized below:

|  | Printed thickness (μm) | Acceleration voltage (kV) | Irradiated dose (kGY) | Irradiated time (sec) |
| --- | --- | --- | --- | --- |
| Ex. 15 | 10 | 75 | 20-80 | 0.02-1 |
| Ex. 14 | 20 | 150 | 20 | 0.24 |
| Ex. 13 | 30 | 200 | 40 | 0.12 |
| Ex. 16 | 50 | 300 | 20-80 | 0.02-1 |

A method and a device for printing the electron beam curing silver paste 5 on the web-like resin film substrate 2, and curing the paste by irradiating the electron beam conducted in EXAMPLES 13 to 16 will be described in detail.

As shown in FIG. 4, in a device line for forming a conductor circuit, an unwinder 3 for holding and unwinding the web-like resin film substrate 2 was disposed to unwind and feed the web-like resin film substrate 2 into the rotary screen printer 4. In the rotary screen printer 4, the antenna conductor circuits 10, 20 and the four corner alignment marks 40 for alignment were printed on the web-like resin film 2 using the electron beam curing silver paste 5, which was fed into the electron beam irradiating device 6 in the next step. In the electron beam irradiating device 6, the electron beam curing silver paste 5 of the conductor circuit 10, 20 and the alignment marks 40 printed on the web-like resin film substrate 2 were irradiated with an electron beam 7 to cure the electron beam curing silver paste 5. Then, the substrate 2 on which the electron beam curing silver paste 5 was printed and cured was fed into a web winder 8. The substrate 2 was wound into the web winder 8 to complete the series of steps. During the steps, the web unwinder 3, a screen 101 of the rotary screen printer 4, and a driven roller 601 of the electron beam irradiating device 6 were operated synchronously by a back face controlling device 9 so that unfavorable stretching and compression would not occur on the web-like resin film substrate 2. In order to pass the web-like resin film substrate 2 through smoothly in each step, a buffer device 301 for absorbing sagging was disposed between respective devices of the web unwinder 3, the rotary screen printer 4, the electron beam irradiating device 6, and the web winder 8.

In EXAMPLES 13 to 16, the screen 101 was a 215 mesh screen, the electron curing silver paste 5 was the paste containing an acrylate type polymerizable compound and silver powder having an average diameter of 2.5 μm.

Comparative Example 10

A heat curing type epoxy resin silver paste was printed using a screen printer on a web-like polyester alloy film substrate having a width of 300 mm as 4×4 conductor circuits (for antenna of an non-contact ID card) with a pitch of 70 mm×95 mm, as shown in FIG. 5. At the same time, cross alignment marks 40 were printed on the four corners. The printed web-like film substrate was heated at 120° C. for 30 minutes in a hot air circulation oven, and taken out from the oven after cooling.

The resultant film substrate was very uneven, and warps at end faces. The antenna conductor circuit 10 being of 4 turns as shown in FIG. 1 had the line width of 0.8 mm in the broadest, and 0.3 mm in the narrowest.

An IC chip having a size of 1.6 mm×2.4 mm with bumps having a diameter of 100 μm, where two bumps were disposed at a 2.8 mm pitch in a diagonal direction, was mounted on the circuit. Precision required for bonding was ±0.2 mm. However, the resin film substrate contracted by a width of about 1 mm. Pitches Pa, Pb (see FIG. 5) between the patterns of the antenna conductor circuit 10 contracted by −0.1 mm to −0.3 mm. A pitch Mp between the alignment marks 40 contracted by a maximum of −1.2 mm. La shown in Figure contacted by about −0.6 mm. The heat curing type epoxy resin silver paste was used for bonding using the four alignment marks 40 printed together with the conductor circuit concurrently on the four corners. Eventually, no bonding was made precisely at the predetermined position.

Reference holes (not shown) were formed on both sides of the same web-like resin film substrate using the same device to avoid contraction. The same test was conducted again using alignment guide pins, but no bonding was made at the predetermined position.

Accordingly, in order to correct position displacement due to contraction, it was necessary to form one or more of electrode position alignment marks near the electrode of the antenna conductor circuit and conduct the alignment for image recognition in each resin film substrate. As a result, it required extra time of 1.5 seconds to 2 seconds for the alignment for the image recognition of electrode position upon bonding IC chip to each resin film substrate. Since sixteen IC chips were bonded to the resin film substrate, it required 28 seconds. There were five defective IC chips among the sixteen IC chips, which appeared to be caused by deformation, i.e., breakage of the antenna conductor circuit.

The disclosure of the present application relates to the subject matters described in Japanese Patent Application No. 11-247043 filed in Sep. 1, 1999, Japanese Patent Application No. 2000-266389 filed in Sep. 4, 2000, and Japanese Patent Application No. 2000-042822 filed in Feb. 21, 2000, the disclosures of which are expressly incorporated herein by reference in its entirety.

It should be noted that, besides those already mentioned above, various modifications and validations may be made without departing from the novel and advantageous features of the present invention. Accordingly, all such modifications and variations are intended to be included within the scope of the appended claims.

The invention claimed is:

1. A method for producing a conductor circuit substrate, comprising:
   (I) forming a circuit pattern on a resin film substrate having a thermal deformation temperature of 150° C. or less by printing a conductive paste containing a conductive substance and an electron beam polymerizable compound with a rotary type printer, and
   (II) irradiating the circuit pattern with an electron beam having an acceleration voltage of 75 to 300 kV for 0.02 seconds to 1 second.

2. The method for producing a conductor circuit substrate according to claim 1, wherein the electron beam is irradiated under the conditions so that the cured matter, obtained when a composition of the paste excluding the conductive substance is cured, has a glass transition point of 0 to 200° C.

3. A method for producing a conductor circuit substrate, comprising:
   (I) forming a circuit pattern on a resin film substrate by printing a conductive paste containing a conductive substance and an electron beam polymerizable compound with a rotary type printer, and
   (II) irradiating the circuit pattern with an electron beam, wherein the conductive paste is an electron beam curing type conductive paste, and a cured matter, obtained when a composition is cured with an electron beam having an acceleration voltage of 150 kV and an irradiated dose of 40 kGy, has an internal stress of 5 to 50 MPa.

4. The method for producing a conductor circuit substrate according to claim 3, wherein the electron beam is irradiated under conditions so that the cured matter, obtained when a composition of the paste excluding the conductive substrate is cured, has glass transition point of 0 to 200° C.

5. A device for producing a conductor circuit substrate, comprising:
   a film unwinder for feeding a resin film substrate,
   a rotary type printer for printing a conductive paste containing a conductive substance and an electron beam polymerizable compound on the resin film substrate provided, the rotary type printer comprising a position correcting device in X and Y axes directions,
   an irradiator for irradiating an active energy beam to a circuit pattern formed by the printing,
   a film winder for winding up the resin film substrate after irradiation, and
   buffers disposed at a front and back of the rotary type printer,
   wherein the rotary type printer and the irradiator are controlled to be operated synchronously.

6. The device for producing a conductor circuit substrate according to claim 5, wherein the rotary type printer is a screen printer.

7. The device for producing a conductor circuit substrate according to claim 5, wherein the electron beam irradiator is an area beam type electron irradiator.

8. The device for producing a conductor circuit substrate according to claim 5, wherein the electron beam irradiator has an acceleration voltage in a range from 75 to 300 kV.

* * * * *